US008560992B2

(12) United States Patent
Wei et al.

(10) Patent No.: US 8,560,992 B2
(45) Date of Patent: Oct. 15, 2013

(54) METHOD FOR INSPECTING A CHIP LAYOUT (71) Applicants: Jingheng Wei, Shanghai (CN); Zheqiu Liu, Shanghai (CN)

(72) Inventors: Jingheng Wei, Shanghai (CN); Zheqiu Liu, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 0 days.

(21) Appl. No.: 13/685,731

(22) Filed: Nov. 27, 2012

(65) Prior Publication Data
US 2013/0152032 A1 Jun. 13, 2013

(30) Foreign Application Priority Data

Dec. 13, 2011 (CN) .......................... 2011 1 0414147

(51) Int. Cl.
G06F 9/455 (2006.01)
G06F 17/50 (2006.01)
(52) U.S. Cl.
USPC ................. 716/112; 716/51; 716/52; 716/53; 716/110; 716/111
(58) Field of Classification Search
USPC ........................ 716/51, 52, 53, 110, 111, 112
See application file for complete search history.

(56) References Cited

U.S. PATENT DOCUMENTS

| | | | | |
|---|---|---|---|---|
| 5,581,475 A | * | 12/1996 | Majors | 716/112 |
| 7,987,442 B2 | * | 7/2011 | Rajski et al. | 716/136 |
| 2003/0101428 A1 | * | 5/2003 | Teig et al. | 716/14 |
| 2005/0044514 A1 | * | 2/2005 | Wu et al. | 716/5 |
| 2006/0117283 A1 | | 6/2006 | Katou et al. | |
| 2008/0085456 A1 | * | 4/2008 | Anderson et al. | 430/5 |
| 2010/0192113 A1 | * | 7/2010 | Brelsford et al. | 716/5 |
| 2011/0111330 A1 | * | 5/2011 | Schultz et al. | 430/5 |
| 2012/0227023 A1 | * | 9/2012 | Bendicksen et al. | 716/112 |

* cited by examiner

Primary Examiner — Nha Nguyen
Assistant Examiner — Brian Ngo
(74) Attorney, Agent, or Firm — Anova Law Group, PLLC (57) ABSTRACT A method is provided for inspecting a chip layout. The method includes providing a chip layout having a plurality of patterns designed according to a design rule and performing a first inspection to the plurality of patterns according to the design rule. The method also includes determining patterns violating the design rule, as violating patterns, and corresponding violation values, and determining violating patterns having a minimum violation value among the violating patterns. Further, the method includes classifying the violating patterns having the minimum violation value into at least one sub-category based on characteristics of the violating patterns having the minimum violation value, and performing a second inspection on a selected violating pattern from the sub-category to determine whether the selected violating pattern and other violating patterns in the sub-category satisfy fabrication process conditions.

9 Claims, 7 Drawing Sheets

METHOD FOR INSPECTING A CHIP LAYOUT

CROSS REFERENCE TO RELATED APPLICATIONS

The present application claims priority to Chinese Patent Application No. 201110414147.1, filed on Dec. 13, 2011, and entitled "Method for Inspecting Chip Layout", the entire disclosure of which is incorporated herein by reference.

FIELD OF THE DISCLOSURE

The present disclosure generally relates to semiconductor manufacturing technology and, more particularly, to a method for inspecting a chip layout.

BACKGROUND

In order to achieve high product yields in mass production of integrated circuit (IC) chips, chip layout designers are often required to follow certain design rules (DRs) from chip foundries in designing chip layouts. The design rules include conditions of intersection of wires, minimum metal line width, and minimum extension of polysilicon over field, etc.

There are a set of design rules to follow when designing a layout of an IC chip, and there are various patterns in the layout. Thus, errors may inevitably exist in the patterns designed by a layout design software or may be caused by a layout designer due to the designer's mistakes. Therefore, after a layout is finished, inspections should be conducted on the patterns in the layout designed according to the design rules prior to actual manufacturing of the IC chip, which is called design rule check (DRC), an inspection process to determines whether a particular design layout conforms with the DRs. During DRC, a plurality of violations, results not complying with the design rule, corresponding to patterns may be found.

However, not all of the violations found need to be corrected. The violation patterns corresponding to the violations should be analyzed according to actual fabrication processes of the foundry to further determine whether the patterns corresponding to the violations contain those patterns that cannot satisfy layout design requirements of the foundry. Only after those unsatisfied patterns are determined and corrected by the designers, the IC chip design can enter the fabrication processes. Thus, DRC is a process ensuring that the DRs are met by the IC chip layout.

However, with the rapid development of ultra large scale integration (ULSI) circuits, the complexity of chip layout increases, and so does circuit design. Thus, the chip foundries often use more restricted rules for the design process as well as more complex design rules, which dramatically increase the amount of DR violations. Even for a single design rule, tens of thousands or even tens of millions of violations may be found after the DRC. But not all violations need to be corrected. For example, for one thousand violations found according to a particular design rule, 999 of them may be negligible according to production experiences and do not have to be corrected. However, the remaining one violation may have to be corrected by changing the corresponding pattern of the chip layout, otherwise the chip product would have quality problems.

Conventionally, the chip layout and the design rules are relatively simple, and the number of violations obtained under DRC is relatively small. Thus, the violations can be inspected one by one manually. Unfortunately, in the current semiconductor manufacturing industry, the level of inspection of the DRC still stays at the conventional level. If tens of millions of violations are found, only a portion of the violations are inspected according to a random sampling inspection method. For example, 50 out of 1000 violations may be randomly sampled and inspected at a sampling rate of 5%. Although the random sampling inspection method may save inspection time, chances are up to 95% that violations which actually need to be corrected will not be found. The problems in the layouts may only be found when a poor product yield arises. At that time, correcting the layout and manufacturing redesigned chips may dramatically increase production cost and prolong the time period of products to market, which causes huge and imponderable losses to the chip foundries.

Therefore, it is desired to provide a method to conduct an accurate and quick analysis on the violations to determine whether patterns corresponding to the violations meet the design requirements of chip foundries, and to correct patterns which do not meet the design requirements, so that successful mass production of chips with high yield may be achieved.

SUMMARY

An embodiment of the present disclosure provides a method for inspecting a chip layout. The method includes providing a chip layout having a plurality of patterns designed according to a design rule and performing a first inspection to the plurality of patterns according to the design rule. The method also includes determining patterns violating the design rule, as violating patterns, and corresponding violation values, and determining violating patterns having a minimum violation value among the violating patterns. Further, the method includes classifying the violating patterns having the minimum violation value into at least one sub-category based on characteristics of the violating patterns having the minimum violation value, and performing a second inspection on a selected violating pattern from the sub-category to determine whether the selected violating pattern and other violating patterns in the sub-category satisfy fabrication process conditions.

DETAILED DESCRIPTION OF THE DISCLOSURE

For simplification and illustrative purposes, the disclosed inspection method may use certain presumptions and/or principles. For example, most design rules (DRs) are related to pattern size, such as dimensions of the patterns along a certain direction, distances between adjacent patterns, and line widths of the patterns. Among these DRs related to the pattern size, patterns having the minimum violation values are the ones most likely affecting design requirements of chip layouts. Therefore, while performing DRC according to the DRs which are related to pattern size, there is no need to inspect all violating patterns, and only the patterns having the minimum violation values need to be inspected. Thus, the inspection efficiency may be greatly improved.

However, in an IC or ULSI chip, even if only patterns having the minimum violations are inspected, there are still hundreds and thousands of patterns that may need to be inspected. So the patterns having the minimum violation values need to be further classified. Then, patterns in a particular category can be inspected one by one to further determine any patterns not actually meeting design requirements of the chip foundry. The patterns not meeting the requirements can then be corrected. Thus, the chip layout can be inspected more accurately, thereby promoting product yield and realizing mass production of chips.

Figure 7:
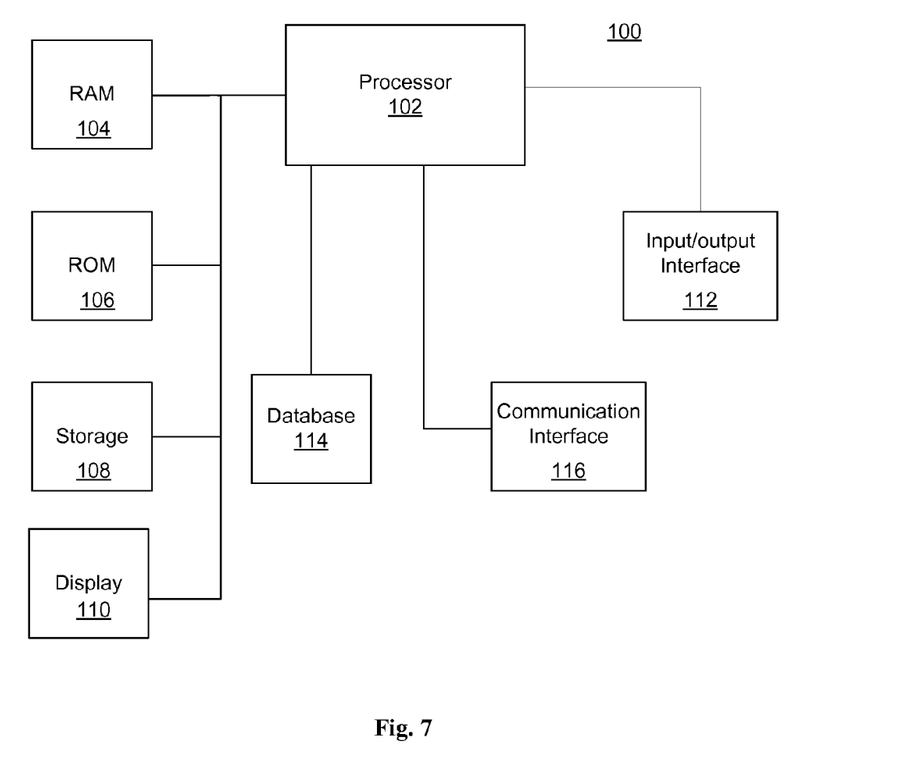
FIG. 7 illustrates an exemplary block diagram of an electronic design automation (EDA) system incorporating certain embodiments of the present disclosure.

FIG. 7 shows an exemplary block diagram of an electronic design automation (EDA) system 100 incorporating certain embodiments of the present invention. The EDA system 100 may include any appropriately configured computer system. As shown in FIG. 7, system 100 may include a processor 102, a random access memory (RAM) unit 104, a read-only memory (ROM) unit 106, a storage unit 108, a display 110, an input/output interface unit 112, a database 114; and a communication interface 116. Other components may be added and certain devices may be removed without departing from the principles of the disclosed embodiments.

Processor 102 may include any appropriate type of general purpose microprocessor, digital signal processor or microcontroller, and application specific integrated circuit (ASIC). Processor 102 may execute sequences of computer program instructions to perform various processes associated with system 100. The computer program instructions may be loaded into RAM 104 for execution by processor 102 from read-only memory 106, or from storage 108. Storage 108 may include any appropriate type of mass storage provided to store any type of information that processor 102 may need to perform the processes. For example, storage 108 may include one or more hard disk devices, optical disk devices, flash disks, or other storage devices to provide storage space.

Display 110 may provide information to a user or users of system 100. Display 110 may include any appropriate type of computer display device or electronic device display (e.g., CRT or LCD based devices). Input/output interface 112 may be provided for users to input information into system 100 or for the users to receive information from system 100. For example, input/output interface 112 may include any appropriate input device, such as a keyboard, a mouse, an electronic tablet, voice communication devices, or any other optical or wireless input devices. Further, input/output interface 112 may receive from and/or send to other external devices.

Further, database 114 may include any type of commercial or customized database, and may also include analysis tools for analyzing the information in the databases. Database 114 may be used for storing information for IC design and fabrication process and other related information. Communication interface 116 may provide communication connections such that system 100 may be accessed remotely and/or communicate with other systems through computer networks or other communication networks via various communication protocols, such as transmission control protocol/internet protocol (TCP/IP), hyper text transfer protocol (HTTP), etc.

Figure 1:
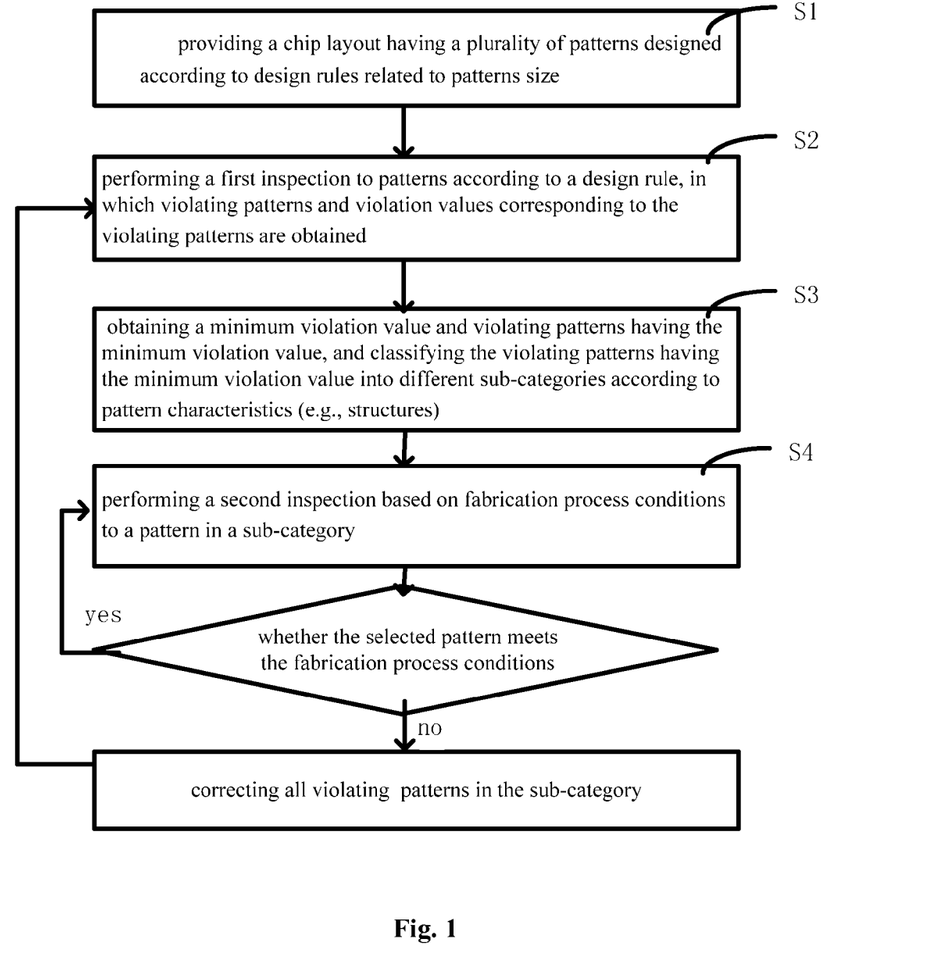
FIG. 1 is a flow chart for illustrating a method for inspecting a chip layout.

During operation, system 100 or, more particularly, processor 102 may perform certain processes to inspect patterns of a chip layout. FIG. 1 illustrates an exemplary process for inspecting a chip layout, performed by system 100 and, more particularly, by processor 102 of system 100.

Figure 2:
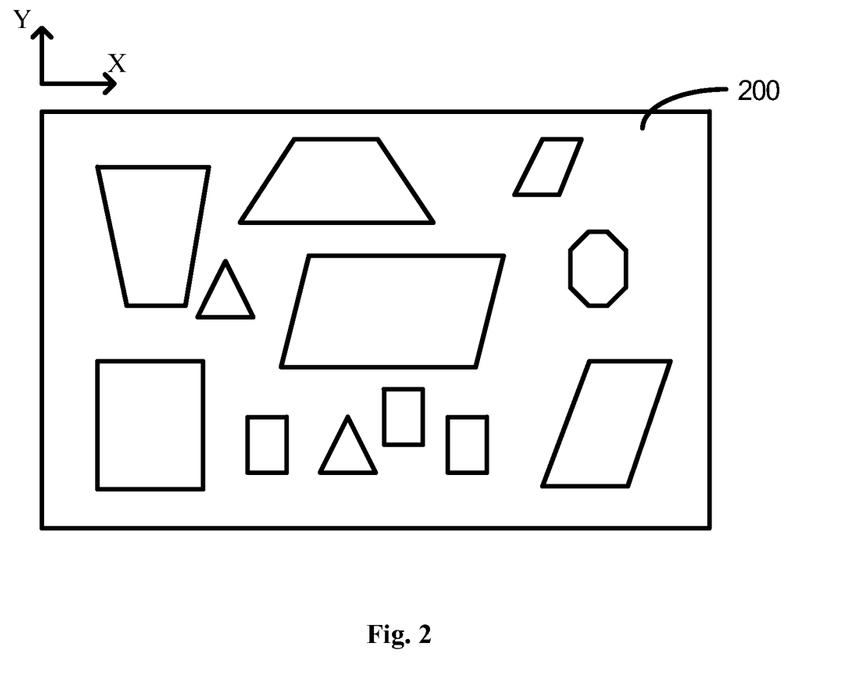
FIGS. 2 to 4 are structural diagrams for illustrating a method for inspecting a chip layout according to embodiments of the present disclosure.

Referring to FIG. 1, at the beginning, a chip layout is provided (S1). The chip layout includes a plurality of patterns and the plurality of patterns may be designed under design rules related to pattern dimension or size. FIG. 2 illustrates an exemplary chip layout.

Referring to FIG. 2, a chip layout 200 is provided, which includes a plurality of patterns (not labeled) and the patterns are designed according to design rules related to pattern size or dimension.

For example, the chip layout 200 may be a chip layout of a ULSI circuit, which is used to make tape-outs (i.e., chip fabrication templates) for mass production of chips. The chip layout is generally designed by professional chip layout designers according to design rules and requirements of chip foundries. Further, the patterns in the chip layout 200 represent metal wires, conductive/electrical plugs, weld pads, and transistors, etc.

A design rule refers to a rule followed by the chip industry or by a particular foundry or foundries to ensure the yield of the chip production. The design rules may cover various aspect of the layout, such as width of patterns, distances between adjacent patterns, conditions of intersection of adjacent wires, minimum line width of patterns, and minimum extension length of polysilicon over field, etc.

A majority of design rules may be related to pattern size or dimension, such as width of patterns, distances between adjacent patterns, minimum line width of patterns, and minimum extension length of polysilicon over field, etc. For example, a first design rule (Rule 1) may be that the width of a pattern along Y direction is 0.72 µm, and a second design rule (Rule 2) may be that the width of a pattern along X direction is 0.5 µm. A large number of design rules may be used.

Returning to FIG. 1, after the chip layout is provided (S1), a first inspection is performed on the patterns of the layout based on a design rule (S2). Patterns violating the design rule and the corresponding violation values of the patterns violating the design rule are obtained from the first inspection.

For example, the first inspection includes obtaining patterns' widths along Y direction, and comparing the obtained widths with the first design rule one by one. If a pattern' width along Y direction is greater or less than 0.72 µm, the pattern does not comply with the first design rule and is defined as a violating pattern that violates the design rule. The violating pattern's dimension along Y direction is defined as the violation value of the violating pattern under the first design rule. All the patterns are compared until all violating patterns and corresponding violation values are obtained.

It should be noted that, in an existing IC chip layout, there may be tens of thousands or even millions of violations of each design rule. But not all violating patterns need to be corrected. Among those violating patterns, some violating patterns satisfy the fabrication process conditions of the chip foundry and, thus, do not need correction. However, some other violating patterns do not satisfy the fabrication process conditions of the chip foundry and, thus, require correction.

The fabrication process conditions may include certain conditions set by the chip foundry for fabrication, such as no one or more of MOS transistors, metal wires, and electrical plugs can be placed within a predetermined distance (i.e., the safe distance) from a pattern. Thus, whether a violating pattern satisfy the fabrication process condition is determined based on whether one or more of MOS transistors, metal wires, and electrical plugs are placed within the predetermined distance from the violating pattern. Other fabrication process conditions may also be used.

Different chip foundries may have different fabrication process conditions. For example, foundry A may require that no one or more of MOS transistors, metal wires, and electrical plugs can be placed within 10 μm from a pattern; while foundry B may require that no one or more of MOS transistors, metal wires, and electrical plugs can be placed within 15 μm from a pattern.

Figure 3:
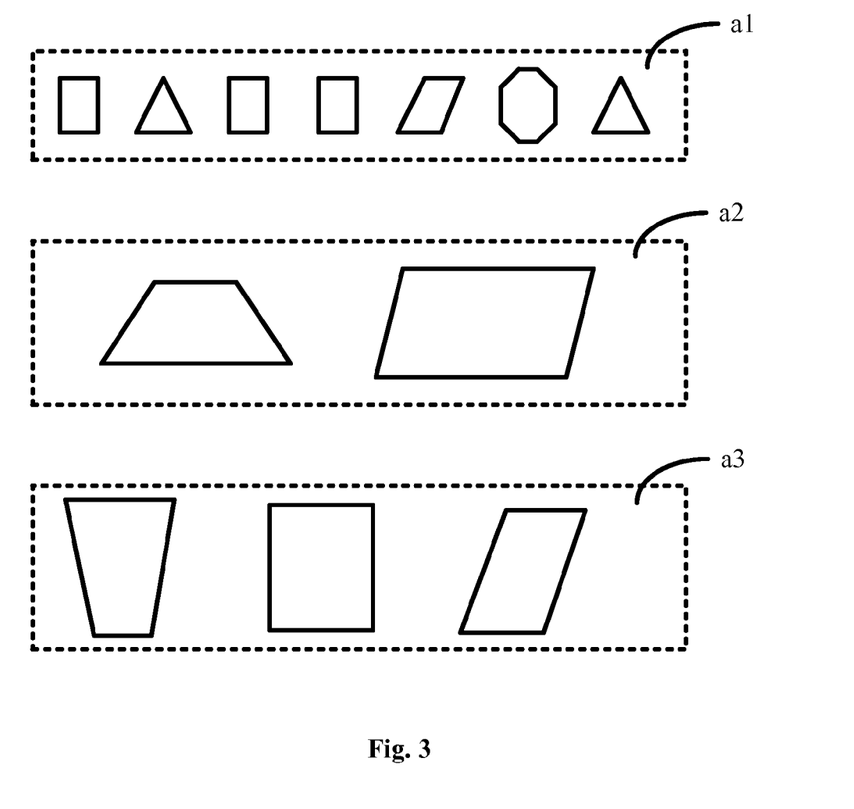

After performing the first inspection to the chip layout 200 according to the first design rule, multiple patterns violating the first rule and multiple volition values may be obtained. Among those violating patterns, patterns with minimum violation values are determined, and those patterns having the minimum violation values are classified into different categories according to pattern characteristics, such as shapes or structures (S3). FIG. 3 illustrates an exemplary determination process for patterns with minimum violation values.

As shown in FIG. 3, violating patterns having the same violation values are put together in a same category. For example, patterns having violation value of 0.5 μm are put together into a first category a1, patterns having violation value of 0.6 μm are put together into a second category a2, and patterns having violation value of 0.7 μm are put together into a third category a3. Thus, although of different shapes, such as triangles, rectangles, parallelograms, or polygons, the patterns in each category a1, a2, or a3 have the same violation value. Further, the categories are ranked according to the violation values to obtain a category with the minimum violation value, i.e., the first category a1. Alternatively, patterns having the minimum violation value may be directly searched, determined, and put together into a same category.

Additionally and/or optionally, errors caused by software programs may need to be excluded first. That is, patterns having violation values markedly less than other violation values may need to be excluded before minimum violation value is determined For example, among violation values 0.01 μm, 0.5 μm, 0.6 μm, 0.7 μm, and 0.8 μm obtained from the first inspection, the violation value 0.01 μm is excluded due to its marked difference. The minimum violation value is then obtained from the remaining violation values (i.e., 0.5 μm).

The patterns with minimum violation values may have representative values. Specifically, under design rules related to patterns size or dimension, if patterns having the minimum violation values satisfy the fabrication process conditions, other violating patterns can also satisfy the fabrication process conditions and do not need to be corrected. Thus, a significant number of patterns can be skipped for further processing to improve inspection efficiency.

Figure 4:
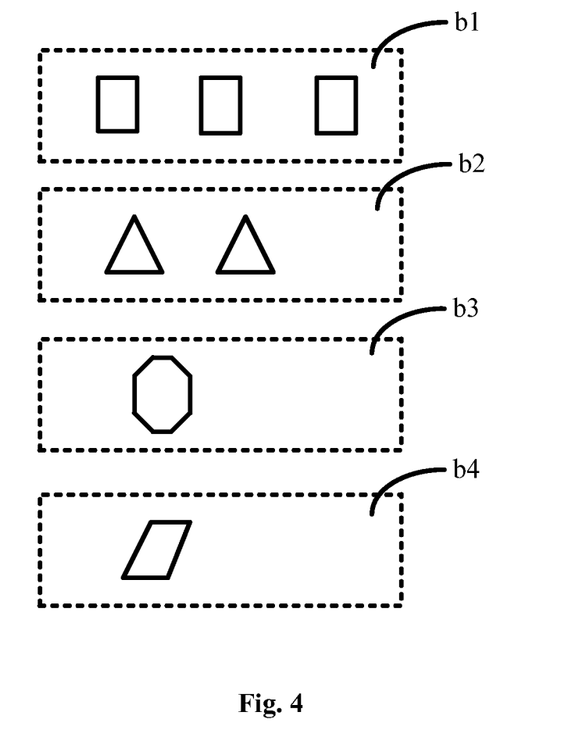

After the patterns having minimum violation values are determined, these patterns are further classified based on the shapes of these patterns (or other characteristics of the patterns). FIG. 4 illustrates an exemplary shape-based classification.

Referring to FIG. 4, a pattern is selected as a reference pattern from the patterns having the minimum violation value. The patterns having the minimum violation value are compared with the reference pattern one by one to obtain an overlapping ratio between the comparing pattern and the reference pattern. For example, a pattern having an overlapping ratio of more than 95% is classified in a same sub-category as the reference pattern.

For patterns in the first category a1 (as shown in FIG. 3) have the minimum violation value of 0.5 μm, the first pattern in the first category a1 is selected as the reference pattern, and the patterns in the first category a1 are compared with the reference pattern one by one. The patterns in the first category a1 having a same overlapping ratio of 100% are classified into a same sub-category as the reference pattern. In other words, patterns having the same shape are classified into a same sub-category which results in a plurality of sub-categories. For example, a first sub-category b1 has rectangle shapes, a second sub-category b2 has triangle shapes, a third sub-category b3 has a polygon shape, and a fourth sub-category b4 has a parallelogram shape. Other sub-categories may also be used.

Returning to FIG. 1, after the violating patterns with minimum violation values having the same shape are classified into sub-categories (S3), a second inspection is performed on the classified violating patterns (S4). Specifically, a first pattern is selected from one of the sub-categories, and the second inspection is performed on the first pattern to determine whether the first pattern satisfy the fabrication process conditions.

If the first pattern does not meet requirements of the fabrication process conditions, it can be determined that the first pattern needs to be corrected. Further, it can also be determined that all patterns in the selected sub-category under the first design rule need to be corrected. On the other hand, if the first pattern meets the fabrication process conditions, it can be determined that the first pattern and all patterns in the selected sub-category do not need to be corrected. That is, the first pattern is representative of other patterns or all patterns in the sub-category. This second inspection may be performed repeatedly until all sub-categories are selected and inspected. For example, after the first pattern is inspected, a second pattern is selected in another category and the second inspection is performed on the second pattern, and so on, until all the sub-categories are inspected.

More particularly, still referring to FIG. 4, the second inspection is performed on all sub-categories b1, b2, b3, and b4. For each sub-category, a pattern is randomly selected from one of the sub-categories to determine whether the selected pattern meets the requirements of the fabrication process conditions, i.e., whether there is one or more of MOS transistors, metal wires, and electrical plugs existing in safe regions of the selected pattern. If one or more of MOS transistors, metal wires, and electrical plugs exist in safe regions of the selected pattern from the sub-category, all patterns in the sub-category need to be corrected.

For example, a pattern is selected from the first sub-category b1 to perform the second pattern inspection according to fabrication process conditions. If the selected pattern does not meet the fabrication process conditions, all patterns in the sub-category b1 needs to be corrected.

If the selected pattern meets the fabrication process conditions, all patterns in the sub-category b1 do not need to be corrected. A second pattern in sub-category b2 is selected to perform the second pattern inspection, similar to the sub-category b1. After all sub-categories b1, b2, b3, and b4 are processed (i.e., through the second inspection), the DRC inspection (e.g., the first inspection and the second inspection) is completed. Further, a different design rule is selected and the inspection process is repeated again with respect to the different design rule. After all design rules are inspected, the chip layout DRC is completed. By classifying patterns with minimum violation values into different sub-categories according to the shapes of the patterns, patterns having the same or similar shapes (e.g., with an overlapping ratio not less than 95%) can be classified into a same sub-category, and only one pattern from each sub-category needs to be inspected based on the fabrication process conditions to determine whether all patterns in the same sub-category meet requirements of the fabrication process conditions. Thus, the pattern inspection efficiency can be significantly improved, and those violating patterns not actually meeting the fabrication process conditions can be accurately found and corrected to improve product yield in mass production.

Figure 8:
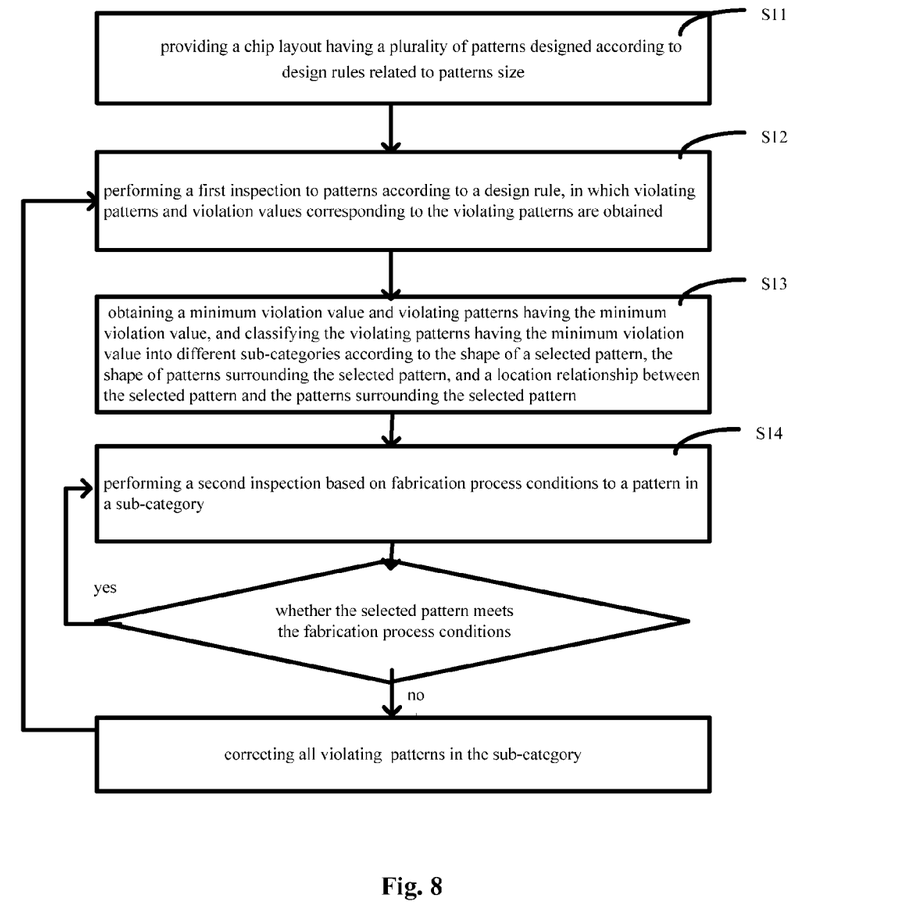
FIG. 8 is a flow chart for illustrating another method for inspecting a chip layout.

FIG. 8 illustrates another exemplary process for inspecting a chip layout. As shown in FIG. 8, similar to S1 in FIG. 1, a chip layout is provided, and the chip layout includes a plurality of patterns and the plurality of patterns designed according to design rules related to pattern dimension or size (S11).

Further, similar to S2 in FIG. 1, a first inspection is performed on the patterns of the layout based on a design rule, patterns violating the design rule and the violation value of the patterns violating the design rule are obtained from the first inspection (S12).

Afterwards, the patterns with minimum violation values are classified into a plurality of sub-categories based on the shape of a selected pattern, the shape of patterns surrounding the selected pattern, and a location relationship between the selected pattern and the patterns surrounding the selected pattern (S13).

Figure 5:
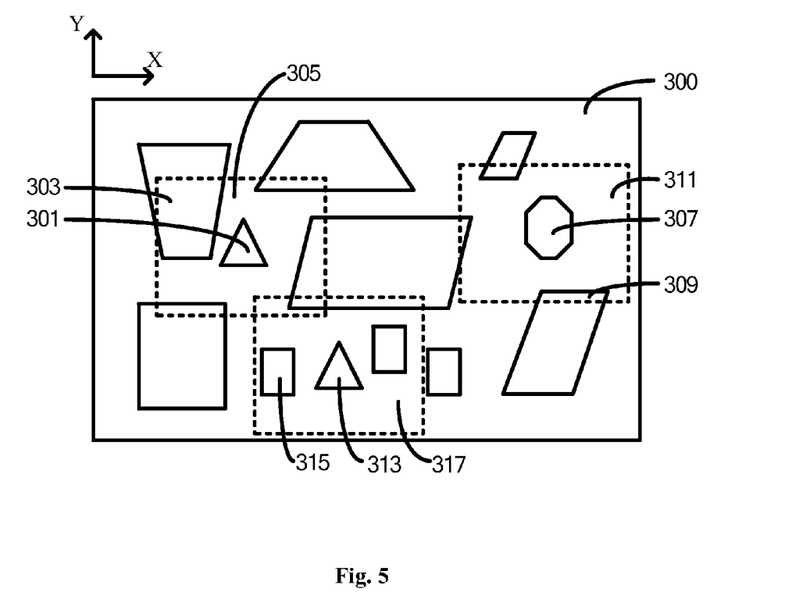
FIG. 5 is a structural diagram for illustrating another method for inspecting a chip layout according to embodiments of the present disclosure.

Under certain circumstances, whether a pattern violating the design rules meet the requirements of the fabrication process conditions is related not only to the pattern itself, but also to surrounding patterns or structures. Thus, the shape of the selected pattern, the shapes of patterns surrounding the selected pattern, and the location relationship between the selected pattern and the surrounding patterns are combined together to classify the selected pattern. That is, violating patterns with same or similar shape, surrounded by patterns with same or similar shape, and having same or similar location relationship with surrounding patterns are classified into a same sub-category. FIG. 5 illustrates exemplary patterns under classification.

Referring to FIG. 5, violating patterns having the minimum violation are classified into different sub-categories according to the patterns shapes, surrounding pattern shapes, and location relationships between the individual patterns and their surrounding patterns.

Specifically, for each violating pattern, a reference region having a particular shape and size is created with the violating pattern at the center. Thus, a plurality of reference regions with same shape and size are created, and each reference region contains at least the corresponding violating pattern at the center and certain patterns surrounding or neighboring the violating pattern.

Further, a reference region may be selected, and the selected reference region is compared with other reference regions one by one. That is, the violating patterns at the center of the selected reference region as well as the surrounding patterns are compared with those of another reference region to obtain an overlapping ratio. Those reference regions with an overlapping ratio greater than or equal to 95% with respect to the selected reference region can then be classified into a same sub-category as the selected reference region, i.e., patterns corresponding to those reference regions are classified into the same category as the violating pattern in the selected reference region.

The reference region may have any appropriate shape, such as a square, a circle, an oval, a circular sector, or a triangle, etc. The size of the reference region may be determined based on particular applications, as long as each of the patterns corresponds to a reference region with same shape and size.

As shown in FIG. 5, violating patterns in category a1 (FIG. 3) are used for illustrative purposes. From the patterns in category a1, a first pattern 301, a second pattern 307, and a third pattern 313 are selected.

Further, a first reference region 305 is formed around the center of the first pattern 301, and the first reference region 305 includes a pattern 303 which is adjacent to the first pattern 301. A second reference region 311 is formed around the center of the second pattern 307 and includes a pattern 309 which is adjacent to the second pattern 309. A third reference region 317 is also formed around the center of the third pattern 313 and includes a pattern 315 which is adjacent to the third pattern 313.

The first reference region 305, the second reference region 311 and the third reference region 317 are squares of the same size, the length of the sides of the squares may be in a range of approximately 0.2 μm-1 μm. In one embodiment, the length of the sides of the squares is approximately 0.5 μm.

Any one of the reference regions may be first selected as a standard reference region for comparison purpose. For example, the first reference region 305 may be selected as the standard reference region. All the reference regions 305, 311, and 317 may then be compared with the selected standard reference region to determine an overlapping ratio between each reference region and the standard reference region.

The first overlapping ratio between the first reference region and the standard reference region is 100% because the first region 305 is taken as the reference region. The second overlapping ratio is obtained by comparing the second pattern 307 with the first pattern 301 and comparing the adjacent pattern 309 in the second region 311 with the adjacent pattern 303 in the first region 305. The third overlapping ratio is obtained by comparing the third pattern 313 with the first pattern 301 and comparing the adjacent pattern 315 in the third region 317 with the adjacent pattern 303 in the first region 305. If the second overlapping ratio and/or the third overlapping ratio are greater than or equal to 95%, the second pattern 307 and/or the third pattern 313 are classified into a same sub-category as the first pattern 301.

Figure 6:
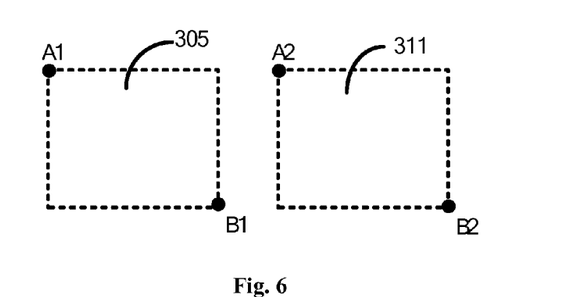
FIG. 6 is a schematic diagram for illustrating a method for obtaining an overlapping ratio by comparing two different regions according to embodiments of the present disclosure.

The overlapping ratio between two reference regions may be obtained by various ways. FIG. 6 illustrates an exemplary overlapping ratio calculation. As shown in FIG. 6, two vertices of the first reference region 305, A1 and B1, are determined, and two corresponding vertices of the second reference region 311, A2 and B2, are also determined. The vertices A1 and A2 can be joined together and the vertices B1 and B2 can be joined together, i.e., the first reference region 305 is overlapped with the second reference region 311, the overlapping ratio of patterns in the first reference region and patterns in the second reference region can then be calculated.

When an overlapping ratio between two reference regions is beyond a predetermined threshold value, such as greater than or equal to 95%, it can be determined that the violating patterns centered in the two reference regions have a same or similar shape, patterns surrounding the violating pattern within the two reference regions have same or similar shapes, and the location relationships between the violating patterns and the surrounding patterns within the two reference regions are the same or similar.

The number of classifying steps may be determined based on a total number of violating patterns having minimum violation values. For example, if there are a significant number of violation patterns having the minimum violation value, the violation patterns may be classified according to other pattern characteristics before being classified according to their shapes, such as area and circumference, etc.

It should be noted that, if a design rule is unrelated to the size or dimension of patterns, such as a design rule on intersection of wires, the DRC may mainly depend on whether there are MOS transistors within a safe distance from a violating pattern. If there are MOS transistors within a safe distance from a violating pattern, the violating pattern does not meet the fabrication process conditions, and needs to be corrected. Otherwise, the violating pattern meets the fabrication process conditions and does not need to be corrected.

By using the disclosed methods for inspecting a chip layout, patterns violating design rules and corresponding violation values are classified. Patterns corresponding to a minimum violation value under a design rule need to be further classified into sub-categories according to pattern structures, where only one pattern in a sub-category needs to be inspected to determine whether the pattern meets the fabrication process conditions or not. If not, all patterns in the sub-category related to the design rule are corrected. Thus, the inspection efficiency can be improved without missing patterns not meeting pattern design requirements, and chip yield can also be improved. Certainly, if certain violating patterns with minimum violation values need to be corrected, such violating patterns with other violation values (e.g., second-minimum violation values) may be determined and similarly inspected.

Moreover, when classifying violating patterns having a minimum violation value under a design rule, reference regions having same size and shape and centering the violating patterns can be formed to compare the violating patterns in the reference regions, patterns surrounding the violating patterns in the reference regions, and the location relationships between the violating patterns and patterns in the reference regions. The violating patterns having same or similar shapes, having same or similar shaped surrounding patterns in the reference regions, and with same or similar location relationship with the patterns in the reference regions may be further classified into a same sub-category such that a second inspection for the fabrication process conditions can be performed. Thus, the inspection results may be more accurate and the chip yield can be further improved.

Although the present disclosure has been disclosed as above with reference to various embodiments, it is not intended to limit the present disclosure. Those skilled in the art may modify and vary the embodiments without departing from the spirit and scope of the present disclosure. Accordingly, the scope of the present disclosure shall be defined in the appended claim.

What is claimed is:

1. A method for inspecting a chip layout, comprising:
    providing a chip layout having a plurality of patterns designed according to a design rule;
    performing a first inspection to the plurality of patterns according to the design rule using a processor of a computer system;
    determining patterns violating the design rule, as violating patterns, and corresponding violation values;
    determining violating patterns having a minimum violation value among the violating patterns;
    classifying the violating patterns having the minimum violation value into at least one sub-category based on characteristics of the violating patterns having the minimum violation value by randomly selecting a pattern from the violating patterns having the minimum violation as a reference pattern, comparing the violation patterns having the minimum violation with the reference pattern one by one, obtaining overlapping ratios between the violation patterns having the minimum violation and the reference pattern, and classifying the violation patterns into different sub-categories according to the overlapping ratios, wherein the characteristics of the violating patterns comprise shapes of the violating patterns; and
    performing a second inspection on a selected violating pattern from the sub-category to determine whether the selected violating pattern and other violating patterns in the sub-category satisfy fabrication process conditions.

2. The method according to claim 1, wherein performing the second inspection further includes:
    when the selected pattern does not satisfy the fabrication process conditions, correcting all violating patterns in the sub-category; and when the selected pattern satisfies the fabrication process conditions, proceeding without correcting any violating pattern in the sub-category.

3. The method according to claim 2, wherein the fabrication process conditions include: no one or more of MOS transistors, metal wires, and electrical plugs existing within a predetermined distance from the violating pattern.

4. The method according to claim 1, wherein the violating patterns whose overlapping ratios not less than 95% are classified in a same sub-category.

5. A method for inspecting a chip layout, comprising:
    providing a chip layout having a plurality of patterns designed according to a design rule;
    performing a first inspection to the plurality of patterns according to the design rule using a processor of a computer system;
    determining patterns violating the design rule, as violating patterns, and corresponding violation values;
    determining violating patterns having a minimum violation value among the violating patterns;
    classifying the violating patterns having the minimum violation value into at least one sub-category based on characteristics of the violating patterns having the minimum violation value by forming the reference regions, each centering a violating pattern having the minimum violation value and having a same shape and size; selecting any one of the reference regions as a standard reference region; obtaining overlapping ratios between the reference regions and the standard reference region one by one by comparing the reference regions with the standard reference region; and classifying violating patterns corresponding to the reference regions into sub-categories according to the overlapping ratios, wherein the characteristics of the violating patterns include shapes of violating patterns, shapes of surrounding patterns in reference regions centered the violating patterns, and location relationships between the violating patterns and corresponding reference regions; and
    performing a second inspection on a selected violating pattern from the sub-category to determine whether the selected violating pattern and other violating patterns in the sub-category satisfy fabrication process conditions.

6. The method according to claim 5, wherein violating patterns corresponding to reference regions with overlapping ratios not less than 95% are classified in a same sub-category.

7. The method according to claim 5, wherein the reference regions have a shape of one of a square, a circle, an oval; a sector, and a triangle.

8. The method according to claim 6, wherein the reference regions are squares with a side length in a range of approximately 0.2-1 µm.

9. The method according to claim 6, wherein obtaining overlapping ratios between the reference regions and the standard reference region one by one comprises:

selecting two vertices of the standard reference region;
selecting two vertices of a reference region from the reference regions;
overlapping the two vertices of the standard reference region and the two vertices of the reference region, respectively; and
calculating an overlapping ratio between the standard reference region and the reference region.

* * * * *